(12) United States Patent
Sorace et al.

(10) Patent No.: US 10,796,830 B1
(45) Date of Patent: Oct. 6, 2020

(54) SINGLE INDUCTOR DUAL OUTPUT CONTROL METHOD

(71) Applicant: NXP B.V., Eindhoven (NL)

(72) Inventors: Christian Vincent Sorace, Falicon (FR); Nicolas Patrick Vantalon, Nice (FR)

(73) Assignee: NXP B.V., San Jose, CA (US)

(*) Notice: Subject to any disclaimer, the term of this patent is extended or adjusted under 35 U.S.C. 154(b) by 0 days.

(21) Appl. No.: 16/514,660

(22) Filed: Jul. 17, 2019

(30) Foreign Application Priority Data

Jun. 4, 2019 (EP) .................................... 19305723

(51) Int. Cl.
*H03F 7/06* (2006.01)
*H01F 7/06* (2006.01)
*H03K 3/012* (2006.01)
*H02M 1/00* (2006.01)

(52) U.S. Cl.
CPC ............. *H01F 7/064* (2013.01); *H03K 3/012* (2013.01); *H02M 2001/009* (2013.01)

(58) Field of Classification Search
CPC .. H01F 7/064; H03K 3/012; H02M 2001/009; H02M 2001/008; H02M 3/33561; G05F 1/46
See application file for complete search history.

(56) References Cited

U.S. PATENT DOCUMENTS

| 7,312,538 | B2* | 12/2007 | May ........................ H02J 1/10 307/31 |
| 8,624,429 | B2 | 1/2014 | Jing et al. |
| 8,773,088 | B2 | 7/2014 | Menegoli et al. |
| 8,975,879 | B2 | 3/2015 | Xu et al. |
| 2020/0076299 | A1* | 3/2020 | Xue ...................... H02M 3/158 |

FOREIGN PATENT DOCUMENTS

WO 2018113996 A1 6/2018

* cited by examiner

*Primary Examiner* — Jung Kim

(57) ABSTRACT

A power controller, including power stages configured to receive input power and charge an inductor, the power stages including output power stages configured to output a first voltage and a second voltage, and feedback circuits to determine error signals of the first voltage and second voltage, a first loop configured to determine an amount of energy to be stored in the inductor using the error signals, and a second loop configured to determine a discharge of the inductor between the first voltage and the second voltage, wherein the second loop determines a moving average of at least one transition point between powering the first voltage and the second voltage.

20 Claims, 8 Drawing Sheets

SINGLE INDUCTOR DUAL OUTPUT CONTROL METHOD

This application is based upon and claims the benefit of priority from prior European Patent Application No. 19305773.9, filed Jun. 4, 2019, which is hereby incorporated by reference for all purposes as if fully set forth herein.

TECHNICAL FIELD

Example embodiments disclosed herein relate generally to a single inductor dual output controller and control method.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a power controller, including power stages configured to receive input power and charge an inductor, the power stages including output power stages configured to output a first voltage and a second voltage; and feedback circuits to determine error signals of the first voltage and second voltage, a first loop configured to determine an amount of energy to be stored in the inductor using the error signals, and a second loop configured to determine a discharge of the inductor between the first voltage and the second voltage, wherein the second loop determines a moving average of at least one transition point between powering the first voltage and the second voltage.

The the first loop may include an output errors adder and a pulse width modulation (PWM) controller.

The second loop may include a plurality of comparators and a moving average block.

The first voltage may be greater than the second voltage.

The inductor may be charged and discharged during successive periods.

A plurality of successive periods may be summed and averaged to determine the moving average between the first voltage and the second voltage.

The plurality of successive periods may be weighted before summing. The moving average may include a plurality of transition points that limit variation from period to period. The plurality of successive periods may be at least two.

The output power stages may include a stepped up voltage output and a stepped down voltage output.

Example embodiments may also include a method of controlling power in a circuit, including receiving input power and charging an inductor using power stages, outputting a first voltage and a second voltage using the inductor, and determining error signals of the first voltage and second voltage, determining an amount of energy to be stored in the inductor using the error signals by a first loop, and determining a discharge of the inductor between the first voltage and the second voltage by a second loop, wherein the second loop determines a moving average of at least one transition point between powering the first voltage and the second voltage.

The method may include using an output errors adder and a pulse width modulation (PWM) controller in the first loop.

The method may include using a plurality of comparators and a moving average block in the second loop.

The method may include charging and discharging the inductor during successive periods.

The method may include summing and averaging a plurality of successive periods to determine the moving average between the first voltage and the second voltage.

The plurality of successive periods may be weighted before summing. The moving average may include a plurality of transition points that limit variation from period to period.

The output power stages may include a boost converter and a buck converter.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
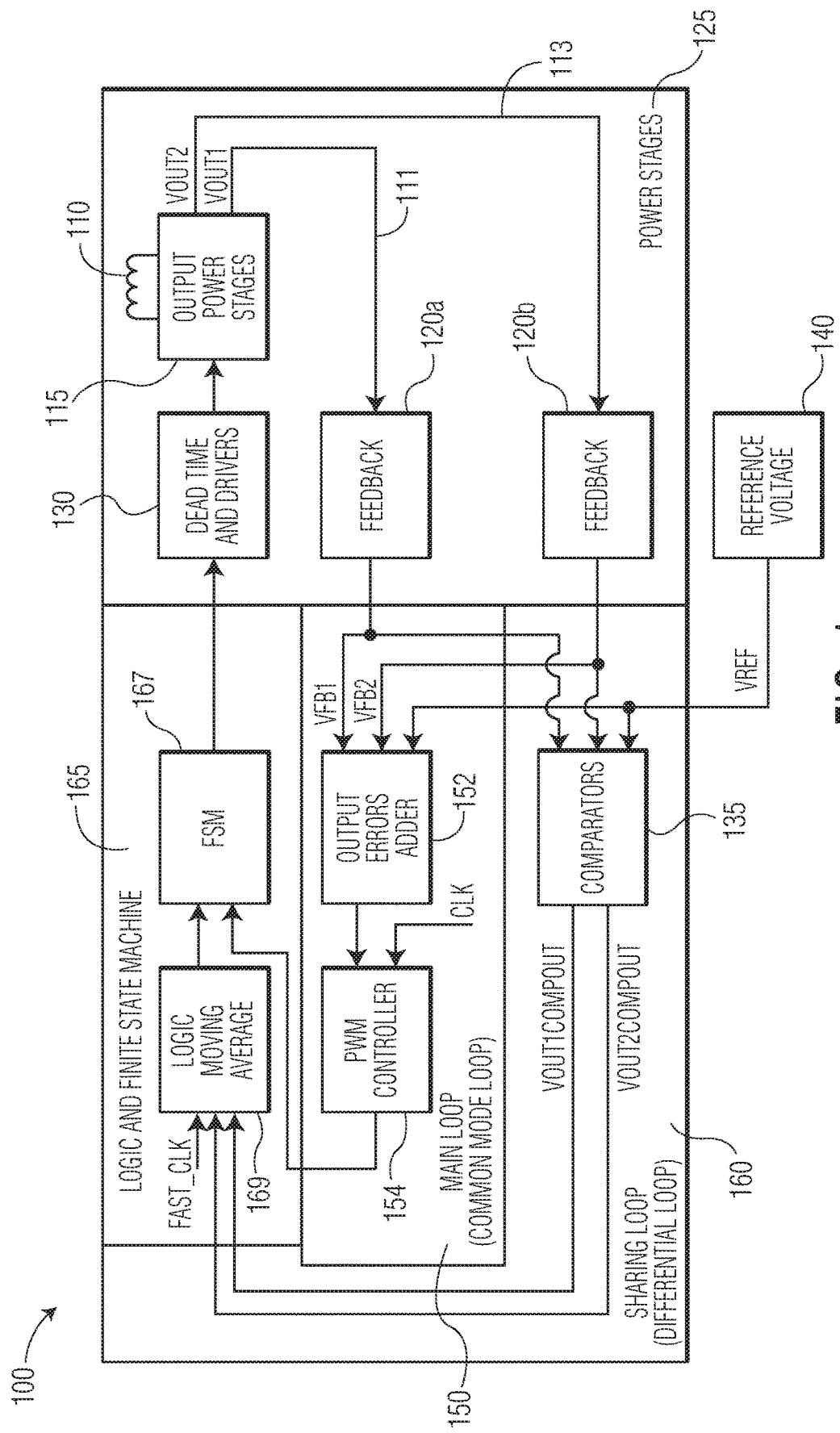
FIG. 1 illustrates a single inductor dual output (SIDO) in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In a DC-DC converter, previous control structures have a single input and a single output. Example embodiments describe a type of DC-DC converter with a single input and dual outputs. An inductor may be a storage element of choice and thus a control method to control the single inductor may be called a single inductor dual output (SIDO) control method. A SIDO controller or SIDO control method as described herein may be a switching converter to switch between at least two different outputs for use in a DC circuit or circuits. Example embodiments may be extended to single inductor, having multiple outputs greater than two.

Example embodiments may construct the SIDO controller and control method using two control loops. A main loop may include a pulse width modulation (PWM) controller configured to control a charging duration of an amount of current to be charged in an inductor. A second sharing loop may include logic comparators and a moving average logic block configured to control the characteristics of a switching cycle between various voltage outputs of a power stage. A power stage may thus include two or more output segments, illustrated for example as Vout1 and Vout2 in FIG. 3B. There may be additional power stages. During the first stage a first output load, the first output load may be driven at Vout1 for a length of time. When the first output load has been satisfied, the current sharing circuit will be transitioned to a second output load and driven at Vout2 for a second length of time. Either Vout1 or Vout2 may have higher values than the other. Some voltage outputs may be stepped up higher than a given voltage input such as in a boost converter. Other voltage outputs may be stepped down below the given voltage input such as in a buck converter. Varying output voltages may be used to supply current to different loads.

Using the circuits and methods described herein may enable an efficient use of one inductor instead of multiple inductors while efficiently managing power delivery of the single inductor. The control structures and methods include external components including an inductor and output capacitors. Power stages may include output power stages and dead time and driver circuits.

The control structure and method combines a PWM controller, comparators and moving average technique to produce a dual output voltage that operates with a constant switching frequency to obtain predictable harmonics in a spectral domain. The main loop may be controlled by a PWM controller. The PWM controller input is the sum of the error of the two outputs voltages (VOUT1 and VOUT2) to define the amount of current to be charged in the inductor. The sum of errors of the different outputs may be used to control the main loop and to compute the total current needed in the inductor to feed the different output loads.

The main loop including the PWM controller determines a duration and concentration of charge for the inductor by controlling the pulse width of the PWM. Example embodiments may control the secondary loop (also called differential loop or sharing loop) with comparators and a moving average technique to manage the inductor current sharing into the different outputs.

This control method reduces design complexity and results in a simplified stability analysis of SIDO. Example embodiments avoid sub-harmonics issues on the spectral domain using the moving average technique. The PWM controller may operate at a constant frequency.

Example embodiments allow the main loop to be designed either in current mode or voltage mode control. The secondary loop (also called differential loop or sharing loop) may be controlled with comparators and moving average technique to manage inductor current sharing of the different outputs. Example embodiments offer a simplified stability analysis because there is no need to consider each SIDO output as a different sub-converter for stability. The secondary loop comparator outputs may be averaged using a moving average technique over a specified number n of PWM periods ($T_{PWM}$). One purpose is to average the comparator outputs in order to filter the secondary loop response. Inductor current sharing may be filtered and averaged between different outputs. A period sharing transition may be defined between the different outputs. The number of samples n may be used to provide an averaged value for a transition point between a first output voltage (Vout1) and a second output voltage (Vout2). The moving average may be used to avoid sub-harmonics on a spectral domain. The number of samples n may be selected according the desired bandwidth of the secondary loop as it is defined by $n \cdot T_{PWM}$. Example embodiments may operate with a single charge and successive discharge inductor current scheme. A single PWM ramp may be used in the main loop. PWM ramps may not be required for the secondary sharing loop.

FIG. 1 illustrates a single inductor dual output (SIDO) control loop 100 in accordance with example embodiments described herein. The control loop 100 may include different sections. A first section may be designated as power stages 125. The power stages 125 include elements for inputting a battery voltage or stable power source, feedback elements to measure characteristics of output power, and input components configured to regulate power delivery in the control loop 100. The control loop may include a main loop 150, also called a common mode loop. The main loop 150 may bear the responsibility of providing a programmable duty cycle to charge the inductor 110 for a given amount of time to achieve a desired charge. The duty cycle may depend on an input voltage Vin, and output voltage Vout, and the load current on each output. A sharing loop 160, also called a secondary or differential loop, may be responsible for determining a transition point between discharging the inductor 110 to power multiple loads. In a SIDO arrangement or in a triple or quadruple output system (also called SIMO single inductor multiple outputs), a comparator element may be provided to correspond to each output load. Feedback data from the power stages 125 is input to the comparators of the sharing loop 160 to determine a desired transition point to switch the inductor charge from one load to another. In other words, the sharing loop 160 may have a purpose of sharing the inductor current between outputs. During current sharing the inductor current may be discharged through the different outputs. Over many periods the transition points between loads may vary. From one period to a next period, a transition point between a first load and a second load may vary slightly as a result of the moving average technique. Another section of the control loop 100 may include a logic block 169 and finite state machine 167. To minimize fluctuation of the transition points, the logic block 169 may include a moving average block configured to ensure transition times from period to period during power delivery do not fluctuate quickly and disruptively. A moving average logic monitors the transition point between the two outputs and averages it over time to feed it into the finite state machine 167. The finite state machine 167 outputs control signals to control the switching converter, or components in the power stages that switch between Vout1 and Vout2 (or other multiple Vouts). The average value for the transition time is used to manage sub-harmonic issues on the spectrum.

In additional detail, the power stages 125 may include an output power stages block 115. The output power stages block 115 may include various DC to DC converter components such as a boost converter to increase a level of a battery voltage or a buck converter to step down a level of input battery voltage. Other converters may include buck-boost converters and non-inverting buck-boost converters. The inductor 110 may be an external component of the control loop 100. The inductor 110 may be connected to a DC power source such as a battery (illustrated in FIG. 6, for example). Boost circuits and buck circuits described herein may include capacitors (not illustrated) to store charge during different switching cycles.

A first output 111 from the output power stages block 115 may be designated Vout1 and a second output 113 from the output power stages block 115 may be designated Vout2. Feedback circuit modules 120a and 120b may be a resistor ladder that receives a portion of the outputs Vout1 and Vout2 to use as a reference to determine feedback signals VFB1 and VFB2. The power stages 125 may also include dead time and drivers 130 that are configured to eliminate shoot-through currents through main power FETs during switching transitions and may provide high efficiency for the boost and/or buck regulator.

Functionally, the main loop 150 may be controlled by the PWM controller 154. Inputs to the PWM controller 154 are the sum of the error of the two output voltages Vout1 and Vout2 to result in an amount of current to be charged into the inductor 110. An error E1 of Vout1 is defined by Vref-VFB1. An error E2 of Vout1 is defined by VREF-VFB2. Output signals from the PWM controller 154 may be sequentialized in a finite state machine 167. A control signal from the PWM controller 154 may be used to control a duration and amount of charging of the inductor 110. The PWM controller 154 may be implemented in analog (voltage mode control or current mode control) or digitally.

The sharing loop 160 also receives feedback signals VFB1 and VFB2 from feedback circuit modules 120a and 120b. Comparators 135 are implemented to determine whether the feedback signal values are higher or lower than a reference voltage 140 which is reflected in the signals Vout1Compout and Vout2CompOut. Output signals Vout1Compout and Vout2CompOut from comparators 135 may be used by a moving average logic block 169 to regulate movement of an inductor charging transition point between Vout1 and Vout2. The current sharing is defined by the logical relationship (Vout1CompOut AND ((NOT) Vout2CompOut)). A number of comparators 135 may correspond to a number of output voltages, which may be more than two. So for M output voltages, each voltage output by power stage 115 is routed to its own feedback circuit and then routed to its own comparator for generating Vout1 thru VoutM used by logic block 136, while the errors of VFB1 thru VFBM are summed by adder block 152. Without the moving average logic block 169, the discharge time of the inductor 110 to power Vout1 would tend to fluctuate due to loading variation. Using the moving average logic block 169, a sample size of n samples may be used having varying time segments. An average of these n samples is taken to determine the transition point which limits the maximum amount of time that the transition point may move from one period to another. By using the moving average of the transition point between Vout1 and Vout2, fluctuations may be eliminated and made predictable, and smooth transitions may occur between output power delivery to multiple outputs.

Figure 2:
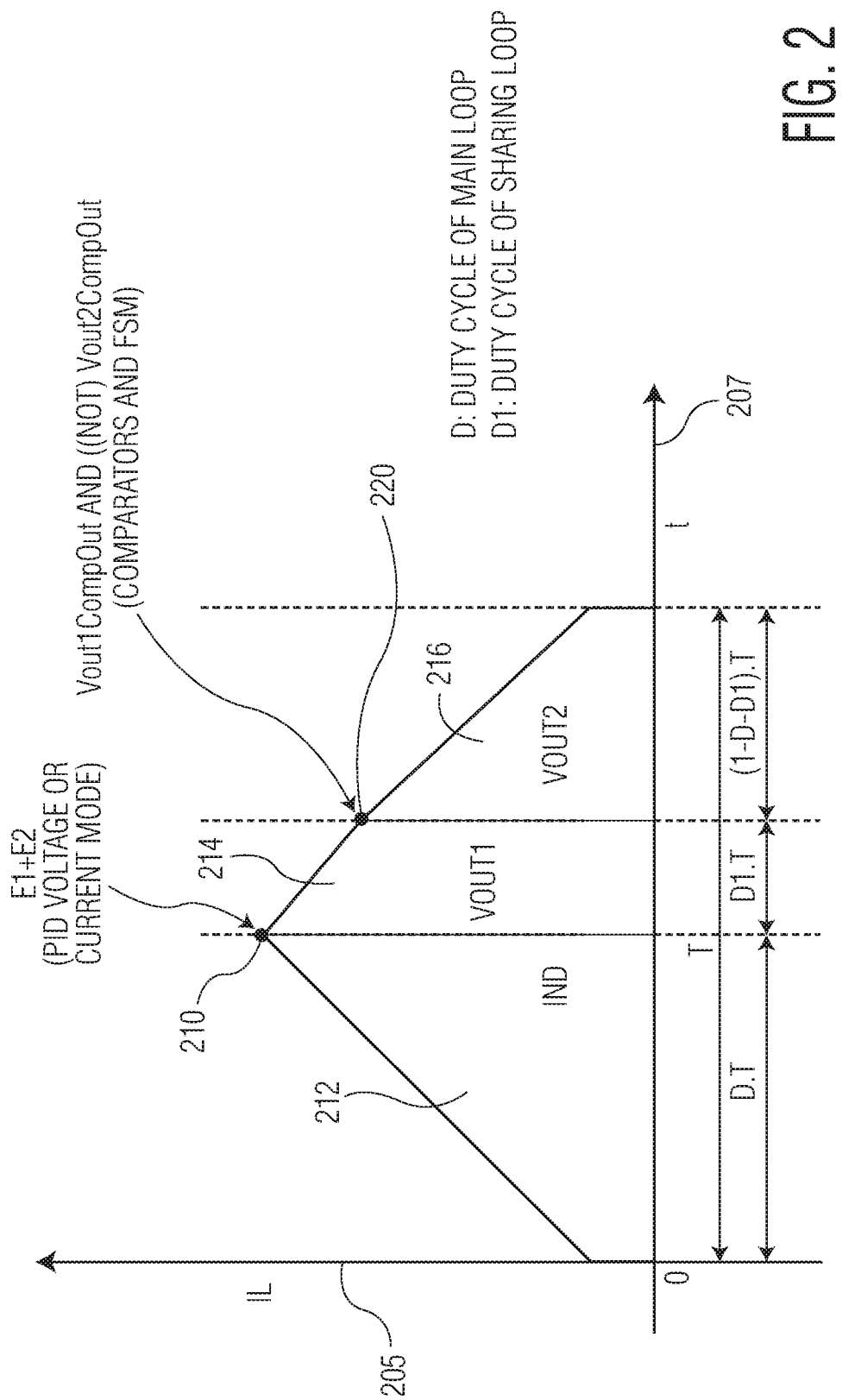
FIG. 2 illustrates an inductor current scheme for a SIDO in accordance with FIG. 1.

FIG. 2 illustrates an inductor current charging and discharging scheme for a SIDO in accordance with FIG. 1. The moving average of the moving average logic block 169 may be implemented and applied in various ways. One way is to use a counter to define an occurrence of the logic signal (Vout1CompOut AND (NOT) (Vout2CompOut)). The moving average block 169 may use a fast clock (for the counter) to determine with accuracy the transition logic signal. The fast clock may use a frequency much higher compared to PWM cycle frequency. The method may capture n samples of the transition time from the fast clock counter by monitoring the transition logic signal (Vout1CompOut AND (NOT)(Vout2CompOut)) and storing the n sample values. These n samples are used to compute the moving average. It corresponds to a specified number n of PWM periods ($T_{PWM}$) and defines the bandwidth of the secondary loop. The moving average may then be computed over successive sets of n samples. The moving average results may be applied as the transition point 220 between Vout1 and Vout2.

FIG. 2 illustrates an ordinate axis 205 representing an amount of charge IL in the inductor 110. The abscissa 207 represents time t. As illustrated in FIGS. 1 and 2, the main loop 150 may charge the inductor 110 for a duration D.T resulting in an amount of charge 212 up to a peak value 210. The peak value 210 may be programmable based on an amount of load to be served. The peak value 210 may be further based upon a sum of error signals E1 and E2 of output signals Vout1 and Vout2. The peak value 210 may also be representative of a proportional-integral-derivative (PID) voltage or current mode. After the peak value 210 is reached, control may be turned over by a main controller (not illustrated) to the sharing loop 160. As illustrated in FIG. 2, the sharing loop 160 may designate a first charge 214 of a first value range to be delivered to a first node Vout1 during time period D1.T. During a second time period (1-D-D1).T, the sharing loop 160 may designate a second charge 216 of a second value to be delivered to a second node Vout2. The node 220 represents a transition point between current delivery to a first load and a second load.

Figure 3A:
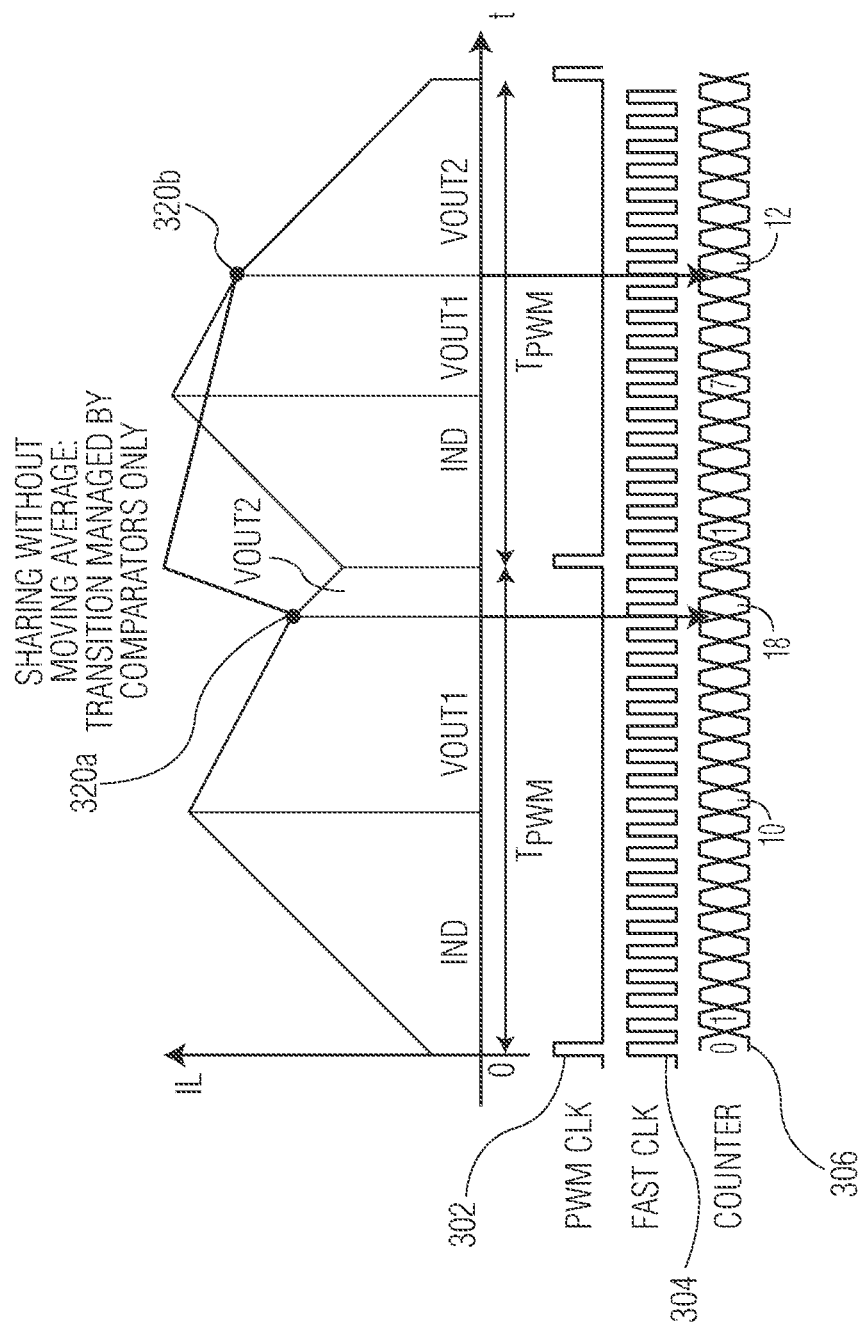
FIGS. 3A and 3B illustrate an effect of moving average on the inductor current in accordance with FIG. 1.
Figure 3B:
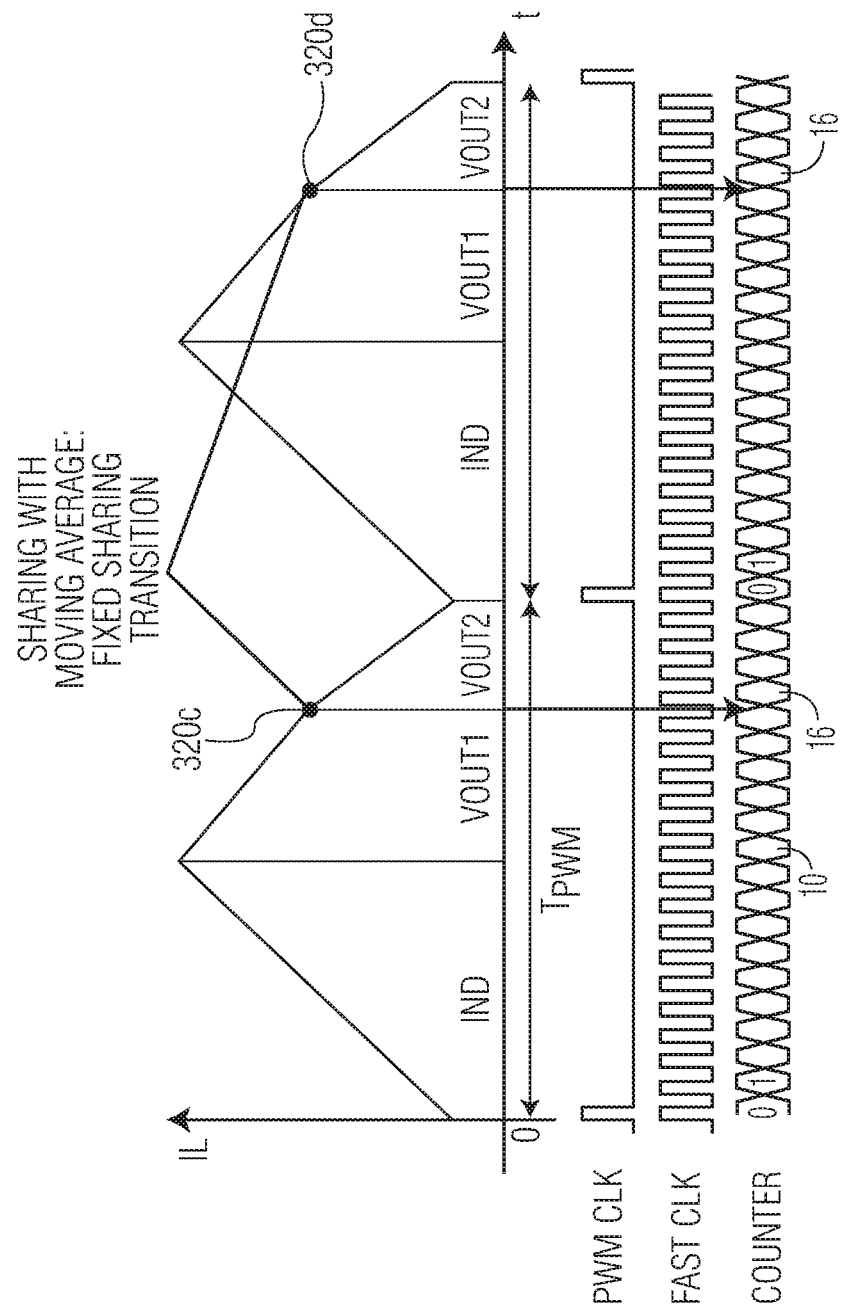

FIGS. 3A and 3B illustrate an effect of moving average on the inductor current in accordance with FIG. 1. In an upper graph without using a moving average, a charge duration of the inductor is inconsistent, and the transition points 320a and 320b from period to period are also inconsistent. Because a transition point is managed using only comparators, and not using a moving average, the transition point 320 fluctuates from cycle to cycle, resulting in an inefficient transition. Example embodiments provide a PWM loop and a sharing loop to reduce design complexity. Comparators may be used in combination with a specific moving average technique to define a filtered transition point of the sharing loop, to limit variations between transition points. Thus the moving average may include a plurality of transition points that limit variation from period to period and are configured to control the spectrum impact.

In FIG. 3B in which the sharing loop having the moving average logic is used, transition points 320c and 320d may have a filtered or limited variation from period to period. The filtered transition point between 320c and 320d allows a predictable sharing of inductor charge between Vout1 and Vout2 from cycle to cycle. The moving average logic acts as a filter on the transition points so that the transition point changes with limited variation. The filtered transition point between Vout1 and Vout2 works to avoid sub harmonics issues in the spectral domain (as also illustrated in FIG. 4). The bandwidth of the secondary loop is defined by $n \cdot T_{PWM}$.

One consideration when designing example embodiments is lessening noise, spurs, harmonics, or sub-harmonics issues for analog components. Traditionally, when transition timing is contemporaneously changed, there is a large variation in the spectrum due to timing changes, and the system becomes unpredictable and sporadic. In previous systems, when transition times widely vary between Vout1 and Vout2, noise can be considerable as transition times fluctuate. When timing is changed significantly every period, there a large variation in a spectrum. The transition point will move quickly and cause spectral noise.

Using the moving average technique described herein, the transition of moving from Vout1 to Vout2 varies slowly with limited variation and becomes more predictable from cycle to cycle. As a result, the spectrum becomes more consistent. One characteristic of example embodiments is controlled noise when using analog components to ensure the noise it out of the working band so as not to impact the radio frequency (RF) system.

In FIG. 3A there is a PWM period 302, a fast clock signal 304 applied, and a counter signal 306 in order to measure transition fluctuations. During a first period of the PWM signal 301, the counter counts the duration of Vout1. The duration of Vout1 in relation to the first transition 520a is about six cycles from count 0 to count 6. At the second transition 320b, the duration of Vout1 is about four cycles, from count 0 to count 4.

From FIG. 3A may be computed a moving average that is illustrated in FIG. 3B. From FIG. 3A, taking the first cycle of Vout1 as six cycles and the second cycle of Vout1 as four cycles, an average and transition point may be illustrated in FIG. 3B that yields roughly five cycles to reflect the moving average. If the load is constant, the system will fix the transition point to roughly five cycles after the peak value. The moving average is a type of filtering, such as a low pass filter.

Example embodiments perform a moving average to lessen the large fluctuations of the transition point, to make the transition points substantially more regular over multiple periods. The spectrum of transitions points may be more predictable and stable, resulting in less noise on the system. When the transition is very minor, as illustrated in FIG. 3B from transition point 320c to 320d, fluctuations are small. Switching between Vout1 and Vout2 from period to period is more predictable and may provide a quick recovery, if desired, from one transition point to the next.

Figure 4A:
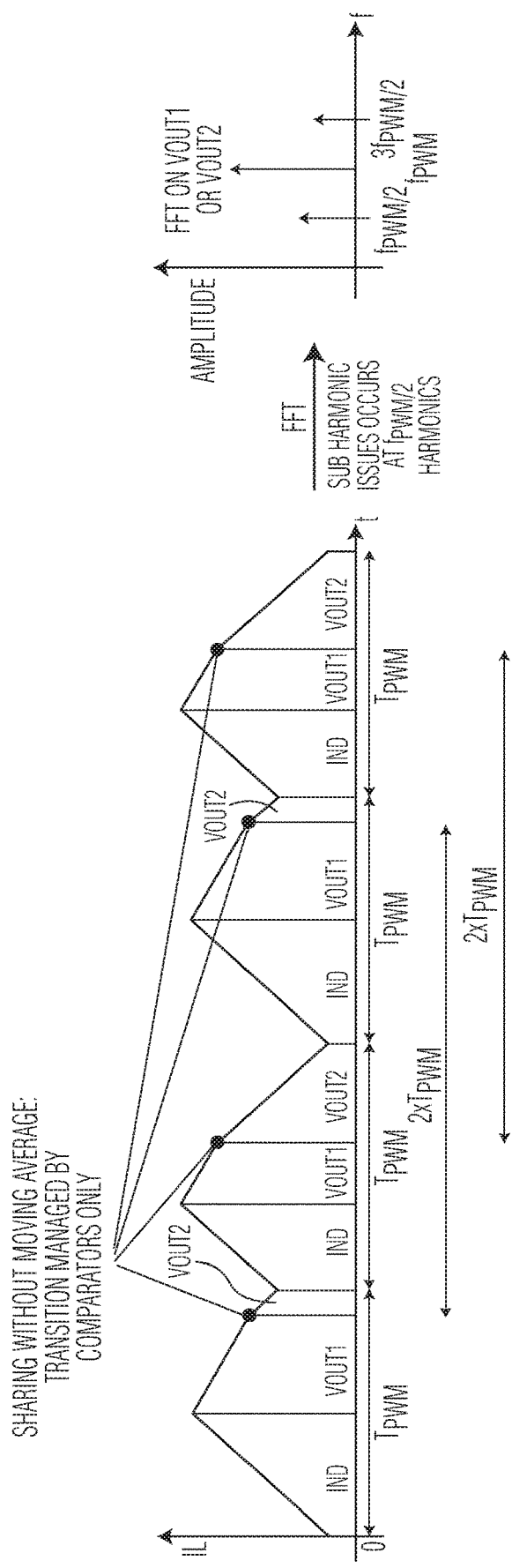
FIGS. 4A and 4B illustrate an effect of a moving average on spectral domain on SIDO outputs in accordance with example embodiments described herein.
Figure 4B:
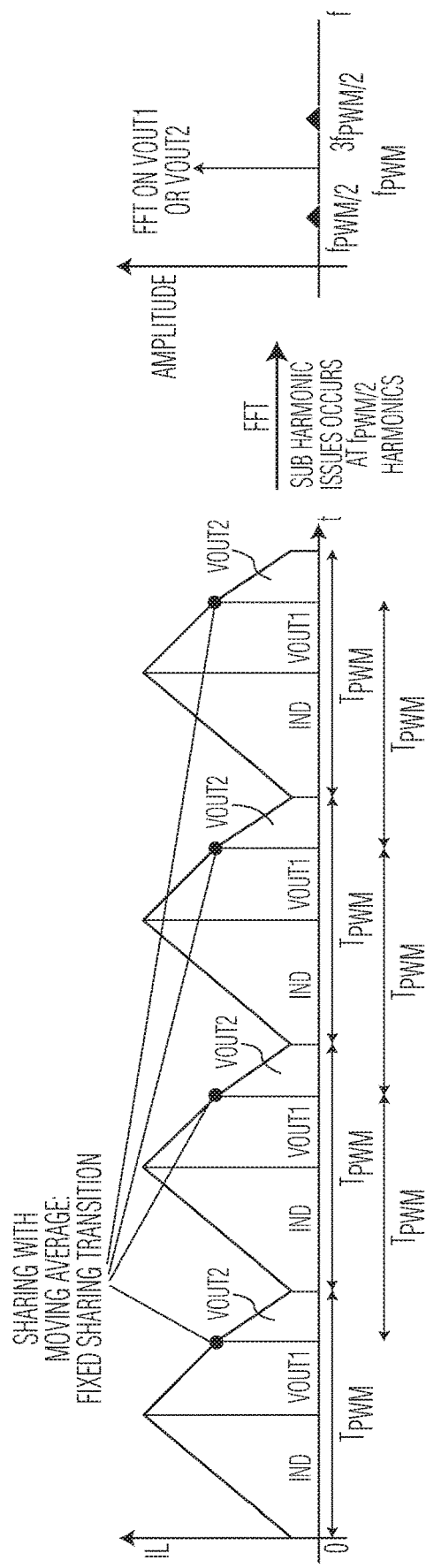

FIGS. 4A and 4B illustrate an effect of a moving average on spectral domain on SIDO outputs in accordance with example embodiments described herein. FIGS. 4A and 4B illustrate a four period duration of charging and discharging cycles of the inductor 310. In FIG. 4A, when not using features of example embodiments described herein, inductor charging times are not consistent from period to period, nor are Vout1 and Vout2 discharging times and values. The transition points between Vout1 and Vout2 vary across a spectrum. In FIG. 4B, using the main loop 150 including PWM controller 154, inductor charge values and times are consistent. Moreover, using the sharing loop 160 including the moving average logic block 169, differences in the transition points from one period to another are similar to a previous period, changing in a filtered and controlled manner if at all.

A moving average may be described in various ways. In statistics, a moving average (rolling average or running average) is a calculation to analyze data points by creating a series of averages of different subsets of the full data set. It is also called a moving mean or rolling mean and is a type of finite impulse response filter. Variations of the moving average include simple, weighted or exponential forms. Given a series of numbers and a fixed subset size, the first element of the moving average is obtained by taking the average of the initial fixed subset of the number series. Then the subset is modified by "shifting forward," that is, excluding the first number of the series and including the next value in the subset. Considering that the subset contains n samples, a window of n samples is created. The moving averaging can be unweighted or weighted according the desires of the filtering. When calculating successive values, a new value may come into the sum and the oldest value drops out. A definition of the simple moving average may be expressed as:

$$\text{moving average} = \frac{X_M + X_{M-1} + \ldots + X_{M-(n-1)}}{n}$$

Where $X_M$ is the sample value captured on the current period, $X_{M-1}$ is the sample value captured on previous period, and $X_{M-(n-1)}$ is sample value captured on n periods before the current one.

Figure 5:
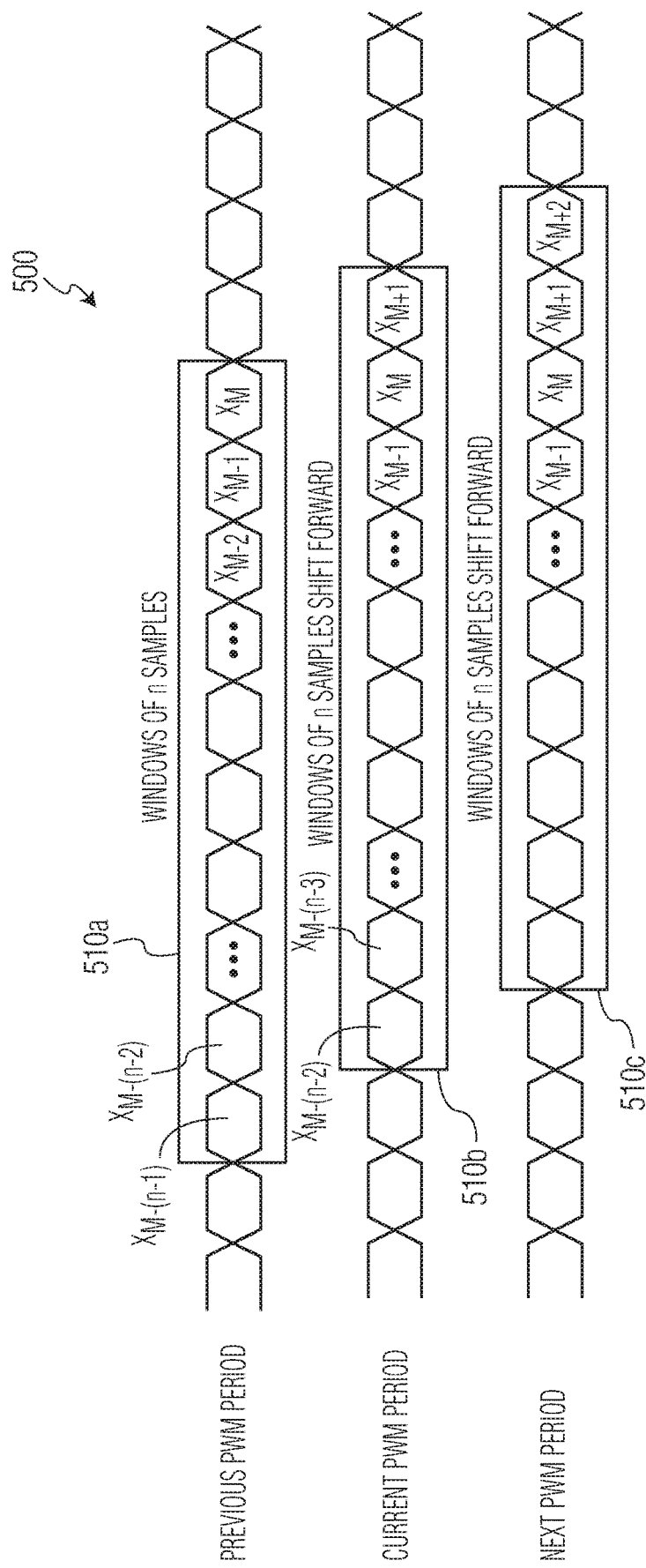
FIG. 5 illustrates an example subset of n samples configured to compute an unweighted moving average.

FIG. 5 illustrates an example subset of n samples 500 configured to compute an unweighted moving average. As illustrated, the moving average may be predicated upon using a predefined amount of n samples to compute the moving average. For example, the window 510a may include at least two and up to about ten, fifteen or more samples of varying X value lengths, depending on the application transient specification. For a limited, filtered, moving average, more samples may be used. For a more variable average, less samples may be summed and averaged. Each X value length may be different, and each length may correspond to a placement of the transition point between Vout1 and Vout2. Instead of using every X value individually to shift the transition point in each period, the whole window is summed and a moving average taken of the summed values. Therefore, from period to period, each transition point may only move a small amount. For the windows 510b and 510c, the windows are shifted to drop out one sample and to pick up a new one. Individual samples may fluctuate from the average, but a new average is then taken to level off the highs and lows, and provide a new transition point that varies in a limited manner.

Figure 6:
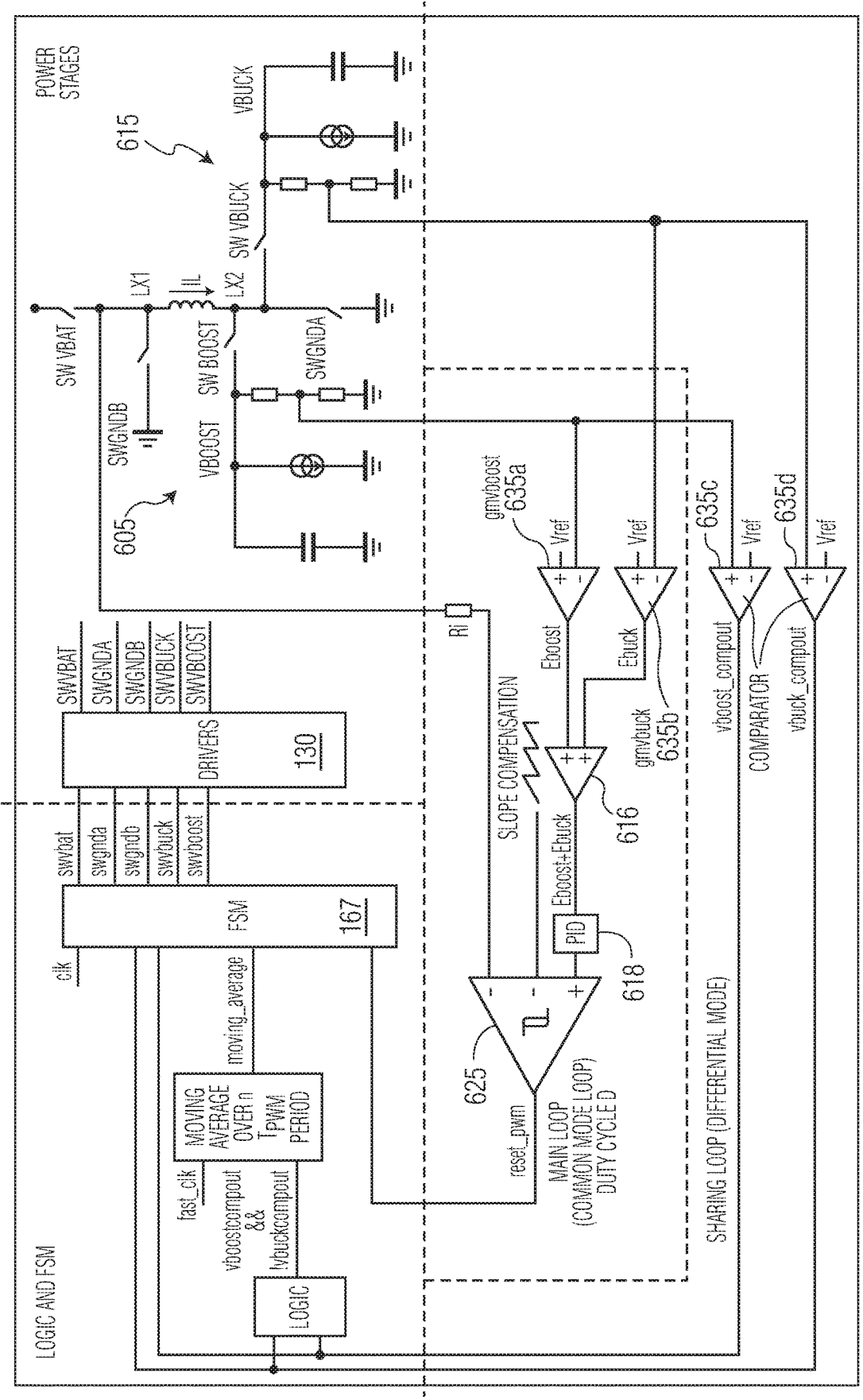
FIG. 6 illustrates an example embodiment with a boost output voltage and a buck with varying output voltages in accordance with FIG. 1.

FIG. 6 illustrates an example embodiment with a boost output voltage and a buck with varying output voltages in accordance with FIG. 1. An example embodiment may include a boost output voltage (VBOOST) from a boost converter 605 and a buck output voltage (VBUCK) from a buck converter 615. Please note that in some embodiments, comparators 135 may be implemented by amplifiers 635c and 635d, output errors adder 152 may be implemented by amplifiers 635a and 635b and PID controller 618, and PWM controller 154 may be implemented by amp 625. VOUT1 may correspond to VBOOST, VOUT2 may correspond to VBUCK. An input voltage is the battery voltage VBAT. Two transconductance amplifiers 635a and 635b for the sharing loop and two comparators 635c and 635d may be used to monitor VBOOST and VBUCK. Transconductance amplifier (gmvboost) 635a outputs an error signal Eboost from the boost converter 605 and transconductance amplifier (gmvbuck) 635b outputs an error signal Ebuck from the buck converter 615. The two error signals are summed 616, converted to a current signal by the PID controller 618, and input to the PWM controller 625. Other inputs to the PWM controller 625 include in input current VBAT/Ri and a slope compensation signal. Control by the PWM controller 625 may be achieved by outputting a reset_pwm signal current mode control to the finite stack machine 167. A moving average is applied over n PWM period ($T_{PWM}$). n that is programmable. The fast clock frequency may be much higher than PWM frequency.

As described herein, the single inductor dual output control circuit and method decrease a design and stability analysis complexity because of a single PWM controller. Example embodiments combine comparators and moving average calculations that are configured to control the secondary loop. Example embodiments greatly simplify a design phase. By using the design described herein, chip area may be saved and a single inductor may be used to achieve dual output power with little fluctuations in transitions. The moving average technique is used on the second loop in order to avoid and filter unwanted sub-harmonics in the spectral domain. Example embodiments improve efficiency at high-load current by using by using a single-charge successive-discharge inductor current scheme, and by using the sum of voltage errors to control the main loop. Using these factors, example embodiments offer a constant switching frequency to obtain predictable harmonics in a spectral domain.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A power controller, comprising:
power stages configured to receive input power and charge an inductor, the power stages including:
output power stages configured to output a first voltage and a second voltage; and
feedback circuits to determine error signals of the first voltage and second voltage;
a first loop configured to determine an amount of energy to be stored in the inductor using the error signals; and
a second loop configured to determine a discharge of the inductor between the first voltage and the second voltage, wherein the second loop determines a moving average of at least one transition point between powering the first voltage and the second voltage.

2. The power controller of claim 1, wherein the first loop comprises an output errors adder and a pulse width modulation (PWM) controller.

3. The power controller of claim 1, wherein the second loop comprises a plurality of comparators and a moving average block.

4. The power controller of claim 1, wherein the first voltage is greater than the second voltage.

5. The power controller of claim 1, wherein the inductor is charged and discharged during successive periods.

6. The power controller of claim 1, wherein a plurality of successive periods are summed and averaged to determine the moving average between the first voltage and the second voltage.

7. The power controller of claim 6, wherein the plurality of successive periods are weighted before summing.

8. The power controller of claim 6, wherein the moving average includes a plurality of transition points that limit variation from period to period.

9. The power controller of claim 6, wherein the plurality of successive periods is at least two.

10. The power controller of claim 1, wherein the output power stages include a stepped up voltage output and a stepped down voltage output.

11. A method of controlling power in a circuit, comprising:
receiving input power and charging an inductor using power stages;
outputting a first voltage and a second voltage using the inductor; and
determining error signals of the first voltage and second voltage;
determining an amount of energy to be stored in the inductor using the error signals by a first loop; and
determining a discharge of the inductor between the first voltage and the second voltage by a second loop, wherein the second loop determines a moving average of at least one transition point between powering the first voltage and the second voltage.

12. The method of claim 11, comprising using an output errors adder and a pulse width modulation (PWM) controller in the first loop.

13. The method of claim 11, comprising using a plurality of comparators and a moving average block in the second loop.

14. The method of claim 11, wherein the first voltage is greater than the second voltage.

15. The method of claim 11, comprising charging and discharging the inductor during successive periods.

16. The method of claim 11, comprising summing and averaging a plurality of successive periods to determine the moving average between the first voltage and the second voltage.

17. The method of claim 16, wherein the plurality of successive periods are weighted before summing.

18. The method of claim 16, wherein the moving average includes a plurality of transition points that limit variation from period to period.

19. The method of claim 16, wherein the plurality of successive periods is at least two.

20. The method of claim 11, wherein the output power stages include a boost converter and a buck converter.

* * * * *